ANALOG-TO-DIGITAL CONVERTER

Filed Feb. 26, 1962 3 Sheets-Sheet 1

INVENTOR.
LANNY L. LEWYN
BY Lyon & Lyon
ATTORNEYS

INVENTOR.
LANNY L. LEWYN
BY Lyon & Lyon
ATTORNEYS

ANALOG-TO-DIGITAL CONVERTER

Filed Feb. 26, 1962 3 Sheets-Sheet 3

INVENTOR.
LANNY L. LEWYN
BY Lyon & Lyon
ATTORNEYS

United States Patent Office 3,219,997
Patented Nov. 23, 1965

3,219,997
ANALOG-TO-DIGITAL CONVERTER

Lanny L. Lewyn, Altadena, Calif., assignor to California Institute Research Foundation, Pasadena, Calif., a corporation of California Filed Feb. 26, 1962, Ser. No. 175,497
7 Claims. (Cl. 340—347)

This invention relates to analog-to-digital converter circuits, and more particularly to improvements therein.

The invention described herein was made in the performance of work under a NASA contract and is subject to the provisions of the National Aeronautics and Space Act of 1958, Public Law 85-568 (72 Stat. 426; 42 U.S.C. 2451), as amended.

An object of this invention is to provide an analog-to-digital converter circuit arrangement which is suitable for use in ultra fast pulse height analysis.

Another object of this invention is the provision of an analog-to-digital converter which is simple to construct.

Yet another object of the present invention is the provision of a novel and unique analog-to-digital converter circuit.

These and other objects of this invention may be achieved in accordance with this invention by the provision of a circuit comprising a plurality of tunnel diodes which are connected in series with one another. A constant current source is connected across the series connected tunnel diode string. A different transistor is connected to the junction between each two tunnel diodes in the string. An unknown voltage which is to be quantized or converted to a digital representation is applied across the tunnel diode string. The various transistors are biased in the quiescent state so as to be drawing a very small base current. The emitter voltage of a transistor is increased when a tunnel diode to which that transistor is connected transfers from one to the other of its stable states. The output of each one of the transistors represents a different input voltage level and can be applied to any desired indicating device. One preferred indicating device is a separate counter for each of the different transistors. At the end of a given measuring interval, the count indications of the various counters indicate the energy levels of the signals which were received.

The novel features that are considered characteristic of this invention are set forth with particularity in the appended claims. The invention itself, both as to its organization and method of operation, as well as additional objects and advantages thereof, will best be understood from the following description when read in connection with the accompanying drawings, in which:

Figure 2:
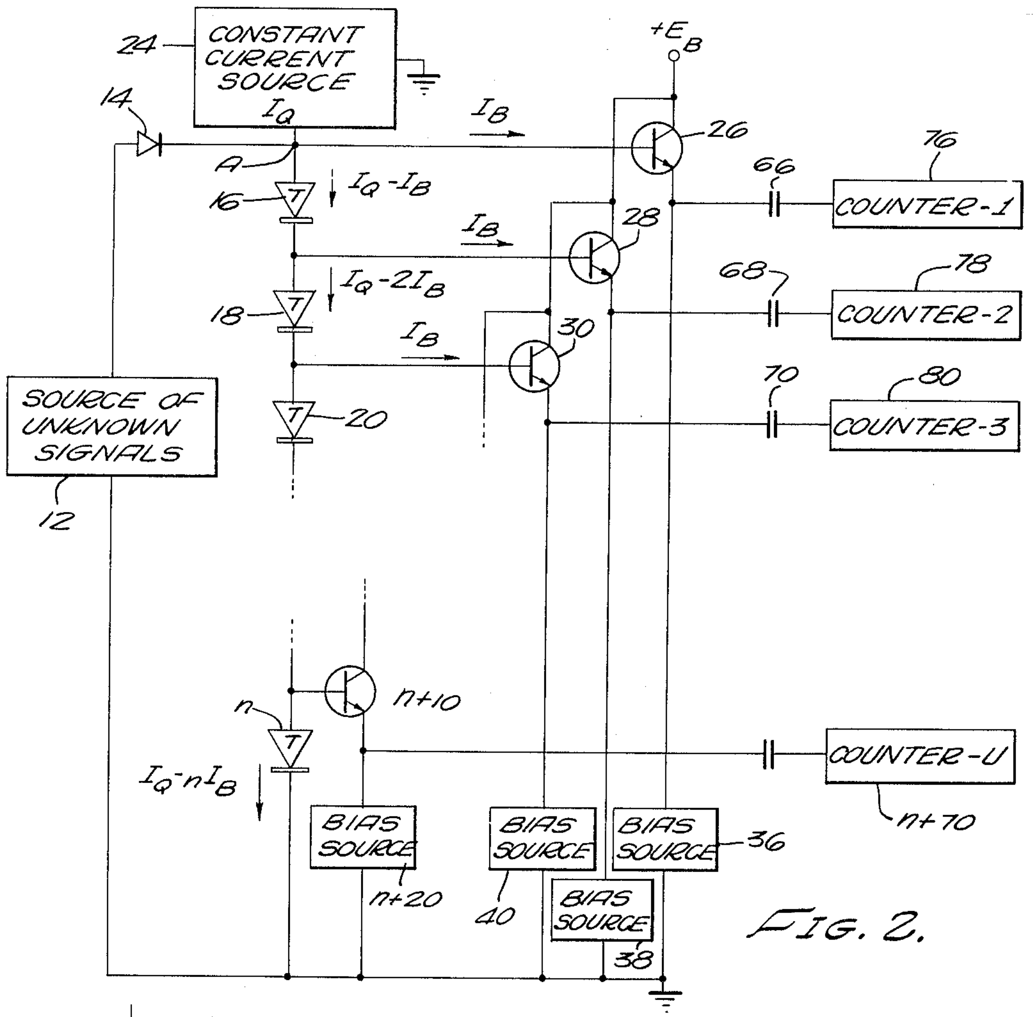
FIGURE 2 is a circuit diagram illustrating an idealized version of an embodiment of the invention for the purposes of explanation.
Figure 3A:
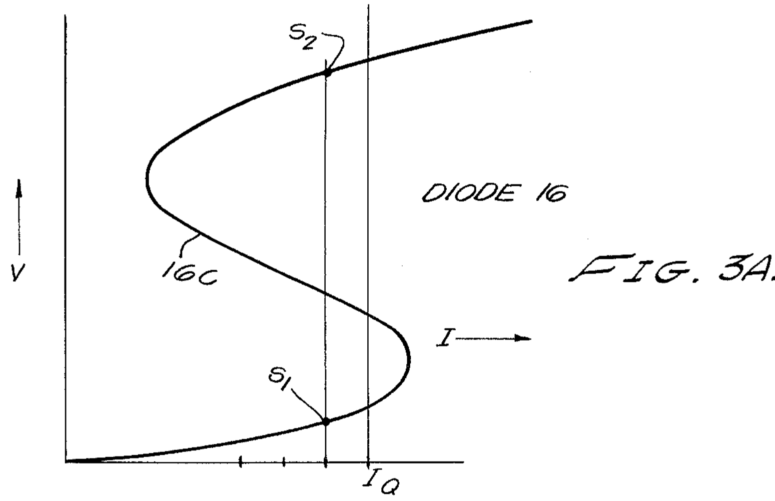
Figure 3B:
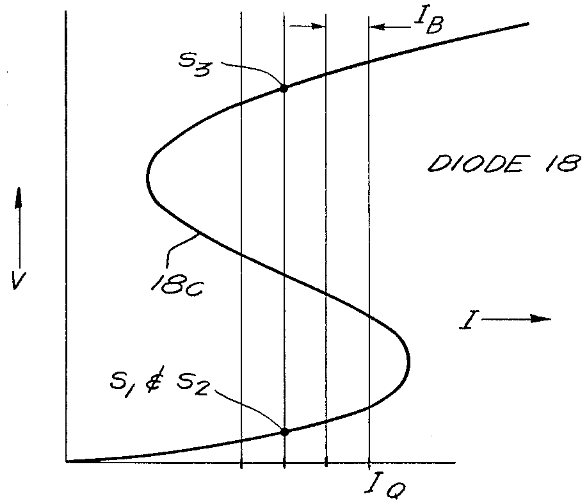
Figure 3C:
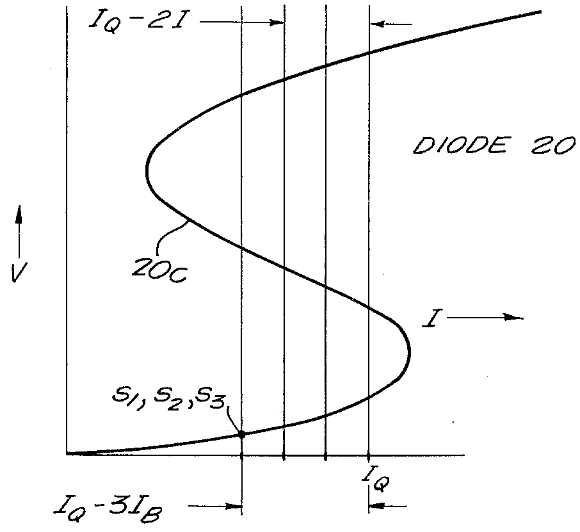
Figures 4, 5:
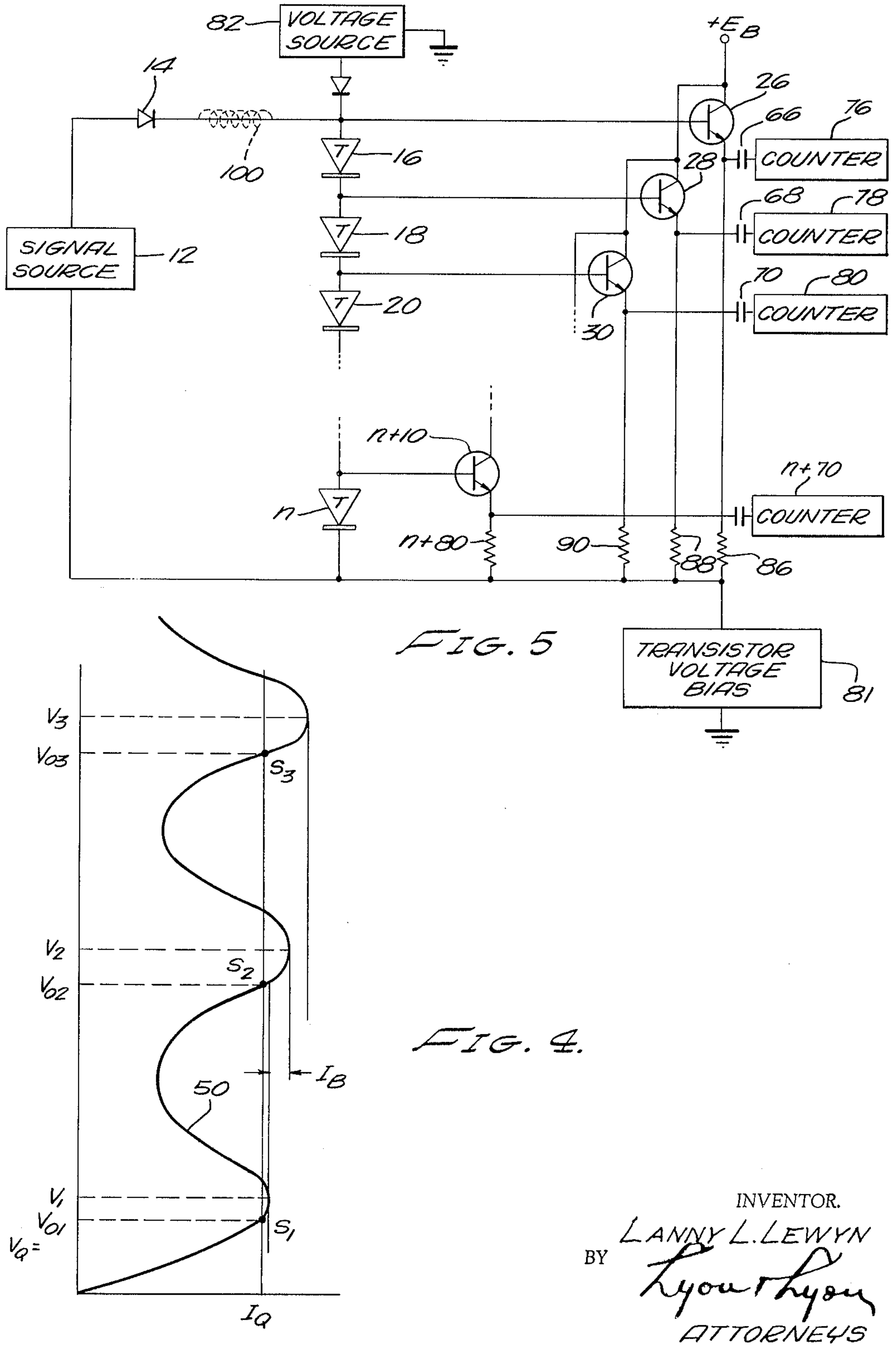

FIGURES 3A, 3B, and 3C are curves showing the characteristics of the first three tunnel diodes in the string of an embodiment of the invention;

FIGURE 4 is a curve representing the dynamic characteristic of the tunnel diode string shown in FIGURE 2; and FIGURE 5 is a circuit diagram of an embodiment of the invention.

Figure 1:
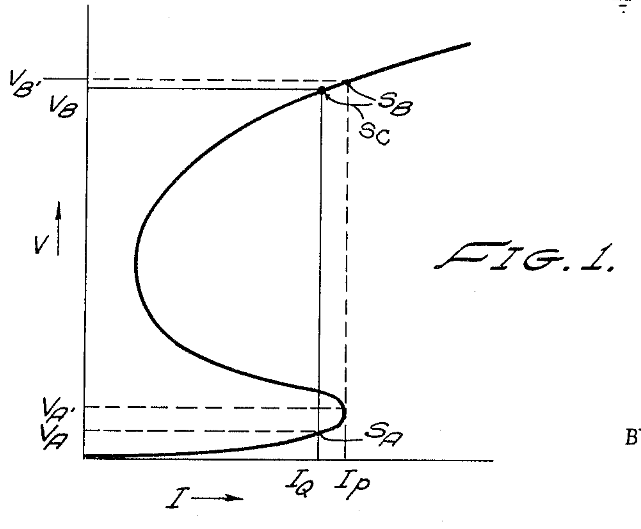
FIGURE 1 is a curve showing the characteristic of a tunnel diode.

Reference is now made to FIGURE 1 of the invention which is a curve representing the current voltage characteristics of a tunnel diode. The curve 10 represents the voltage-current characteristic which is derived from a typical S-type negative resistance element of which the tunnel diode is an example. If the tunnel diode is connected to a current source $I_Q$, it will be noted that it has two stable points in its characteristic indicated by the points $S_A$ and $S_B$ on the characteristic curve 10. At point $S_A$, a voltage $V_A$ exists across the tunnel diode; at points $S_B$ the voltage is $V_B$.

Assume, now, that the current applied to the tunnel diode is increased to the value $I_P$. The tunnel diode will then switch until it comes to rest at its other stable point $S_B$. Upon the removal of the increased current, the tunnel diode will return to point $S_C$. It can be returned to point $S_A$ by interruption and then re-application of bias current.

FIGURE 2 is a circuit diagram of an embodiment of the invention, shown to explain the principles which apply thereto. In accordance with this invention, the source of unknown signals 12 is connected through a diode 14 to one side of a string of tunnel diodes, respectively 16, 18, 20—, *n*. The tunnel diode *n* is connected back to the other side of the source of unknown signals 12. A constant current source 24 is also connected to the string of tunnel diodes.

A first transistor 26 has its base connected to the anode of the first tunnel diode 16 in the string. A second transistor 28 has its base connected to the junction between the anode and cathode of the respective second and first tunnel diodes, respectively 18, 16. A third transistor 30 has its base connected to the junction between the anode and cathode of the respective third and second tunnel diodes in the string. A last transistor, $n+10$ has its base connected to the junction of the anode of the *n* tunnel diode and the cathode of the next-to-last tunnel diode in the string. The collectors of all the transistors are connected to a source of operating potential $E_B$. Each one of the transistors has its emitter connected to a separate bias source, respectively 36, 38, 40, $n+20$, to be biased to draw a very small base current $I_B$ during the quiescent state.

FIGURES 3A, 3B, and 3C show the respective characteristic curves 16C, 18C, 20C for tunnel diodes 16, 18, and 20. The constant current source supplies a total current $I_Q$ to the tunnel diode string and the associated transistors. Referring now to the drawing, since each transistor draws a small base current $I_B$, the quiescent stabilization point $S_1$ for tunnel diode 16 is at $I_Q-I_B$. The quiescent stabilization point $S_1$ for tunnel diode 18 is at $I_Q-2I_B$, and the quiescent stabilization point $S_1$ for tunnel diode 20 is at $I_Q-3I_B$. The quiescent stabilization point for tunnel diode *n* is $I_Q-nI_B$.

Upon the application of an unknown voltage across the tunnel diode string, since, as may be seen from the curve 16C, tunnel diode 16 requires the least amount of current to be moved to its region of instability, it will fire first and will move toward its second point of stability at $S_2$. As a consequence of the voltage increase at its base, transistor 26 is driven and its emitter voltage rises accordingly. The output signal at the emitter is then applied through the capacitor 66 to drive the counter 76.

Should the unknown voltage be sufficient to supply a current of $2I_B$ plus the same amount of current required to go from $I_Q$ to the point of instability, as was required for tunnel diode 16, then tunnel diode 18 is fired, and, in moving to its second stable point at $S_3$, it produces enough voltage at the base of transistor 28 to drive it and the voltage at the emitter rises accordingly. The output signal at the emitter of transistor 28 is applied by capacitor 68 to the counter 78.

If the unknown voltage is sufficient to supply a current of $3I_B$ plus the same amount of current required to go from $I_Q$ to the point of instability, as is required for the two preceding tunnel diodes, then tunnel diode 20 is fired. Transistor 30 emitter voltage rises with the base voltage and an output is applied from the emitter through capacitor 70 to counter 80.

FIGURES 3A, 3B, and 3C are shown to assist in understanding the circuit operation.

FIGURE 4 shows a composite characteristic curve 50 for current-voltage conditions for the tunnel diode string taken at point A on FIGURE 2, which is the junction of the constant current source 24 with the first tunnel diode 16, base of the transistor 26, and the connection from the unknown input voltage. Under quiescent conditions, current $I_Q$ is provided, and, therefore, the line drawn at $I_Q$ may represent the load line for the system. It determines the points of stability $S_1$, $S_2$, $S_3$ which the system will assume with each increase in the unknown voltage which is applied. Initially, with a current $I_Q$ and no unknown voltage input, there is a voltage $V_{01}$ existing at point A. Upon receiving a voltage $V_1$ from the unknown signal source, the first tunnel diode in the string is triggered. The voltage developed across the tunnel diode string will be slightly larger than $V_{02}$ until the unknown voltage signal is removed, at which time the voltage subsides to $V_{02}$ and the string is at point $S_1$. of its characteristic curve. The circuit will be maintained at this point unless the current $I_Q$ is removed, at which time point A will return to the conditions $S_1$.

In order to trigger the second tunnel diode in the string, a voltage $V_2$ must be provided by the unknown signal source. This voltage must increase the current $I_Q$ by an amount $I_B$, as well as by the same basic amount of current as was required to go from point $S_1$ to the point of instability. The third stability point for the junction A is at $S_3$ when the voltage across the string is at $V_{03}$. The voltage required to fire the next tunnel diode in the string is $V_3$. This voltage must provide $2I_B$ and the basic amount of current. Accordingly, with the conditions described, the last tunnel diode in the string is "more stable," i.e., more voltage is required to trigger it to the negative resistance region than is required for the next-to-the-last ($n$–1) tunnel diode. The next tunnel diode in the string ($n$–2) is still nearer the negative resistance region than either of the preceding tunnel diodes. The first tunnel diode 16 which carries the most current will trigger on the smallest voltage or current rise. The foregoing shows why the tunnel diode string provides an orderly operation in response to an applied unknown voltage, rather than a random operation.

One need only supply enough current to any one of the tunnel diodes to arrive at the negative slope portion of its dynamic characteristic. The rest of the energy required to make the transition to its second stable state is then supplied by the action of the current source and tunnel diode negative resistance. The voltage increase across a tunnel diode is applied to the base of a succeeding transistor and the emitter voltage of that transistor follows the base voltage. The output of a driven transistor is applied from its emitter through a capacitor to advance the count of the counter coupled thereto. Accordingly, in response to an unknown voltage applied to the tunnel diode strings, the number of tunnel diodes transferred, as well as which ones, is dependent upon the amplitude of the voltage applied. Each one of the transistors which is driven, i.e., 26 and 28, in response to an unknown voltage applied to the tunnel diode string, drives the following counters (i.e., 76, 78). The value of an applied voltage is indicated by the counters. The energy distribution of a series of unknown voltages is indicated by the counts in the counters.

Since this invention attempts to quantize a voltage signal into discrete levels, it is important that the difference of neighboring levels or channel voltage widths remain as constant as possible. From FIGURE 4, it may be observed that the voltage difference between any two levels is directly associated with one particular negative resistance element. Thus, each channel voltage width is principally related to the voltage transition of one nonlinear negative resistance element.

No reset apparatus is shown in FIGURE 2. In order to reset the circuit shown, it is necessary to either temporarily remove the constant current supply $I_Q$ or to temporarily clamp the point at the top of the tunnel diode string to a given voltage level with a suitable transistor switch (not shown) after a desired interval for reading has passed.

FIGURE 5 is a circuit diagram of a preferred arrangement for this invention which automatically resets and does not, therefore, require any auxiliary reset apparatus. Those circuit components in FIGURE 5 which perform the same functions as circuit components shown in FIGURE 2 are given similar reference numerals. Effectively, the difference comprises providing a voltage source 82 to bias the tunnel diode string to a voltage at which a current $I_Q$ will flow. The multiple bias applied for the respective transistors 26 through $n+10$ are replaced by a single transistor bias source 81 from which connection is made to the respective emitters of the transistors 26, 28, 30, $n+10$, through respective resistors 86, 88, 90, $n+80$.

The circuit shown in FIGURE 5 will return to the original quiescent state a few millimicro seconds after an input signal is removed. The delay in return is caused by stray circuit capacitance and input circuit inductance represented as a lumped inductance 100 by the dotted lines which are connected between the diode 14 and the first tunnel diode 16. This stray input circuit inductance is usually sufficient to sustain well defined converter element transitions. The circuit shown in FIGURE 5 is capable of closely tracking all available pulse sources having up to 100 millimicro second rise time.

There has accordingly been described and shown herein a novel, useful, and simple analog-to-digital converter. This converter can convert input voltage into amplitude level indications at an extremely rapid rate, and further can follow pulse height changes at an extremely rapid rate. The device constitutes a solid state analog-to-digital converter.

I claim:

1. An analog-to-digital converter comprising a plurality of negative resistance elements each having the characteristic that for a constant current applied thereacross the element has two stable states, the voltage across each said element being different when it is in its second stable state than when it is in its first stable state, and said element being capable of being triggered from one to the other of its stable states by altering the voltage applied thereacross by a predetermined amount, means connecting said plurality of negative resistance elements in series, a separate means for detecting the output of one of said negative resistance elements when it is transferred from its first to its second state of stability for each one of said negative resistance elements, means for connecting each one of said means for detecting to a different one of said negative resistance elements, means for applying an unknown signal whose amplitude is desired to be digitalized across all said negative resistance elements, and means for utilizing the outputs of said means for detecting.

2. An apparatus as recited in claim 1 wherein each one of said negative resistance means is a tunnel diode.

3. An apparatus as recited in claim 1 wherein each one of said means for detecting draws a quiescent state current through said negative resistance means.

4. An analog-to-digital converter comprising a plurality of tunnel diodes, each tunnel diode having an S-type negative characteristic whereby for a constant current bias it manifests a first and second stable state and can be driven from the first to the second stable state by increasing the voltage existing thereacross, means for connecting said plurality of tunnel diodes in series, means for applying a constant current bias across said tunnel diodes to place them in their first stable state, a separate voltage responsive detecting means to detect when a tunnel diode is driven from its first to its second stable state for each one of the tunnel diodes, means each coupling each voltage responsive detecting means to each tunnel diode, and means for connecting said source of signals to be analyzed across said tunnel diodes connected in series whereby the number of tunnel diodes which are driven from their first to their second stable states is determined by the amplitude of a signal applied across said tunnel diodes connected in series from said source of signals.

5. An analog-to-digital converter as recited in claim 4 wherein each one of said voltage responsive detecting means includes means for biasing each of said voltage responsive detecting means for deriving a quiescent current from said plurality of tunnel diodes connected in series.

6. An analog-to-digital converter as recited in claim 4 wherein each of said voltage responsive detecting means includes a transistor.

7. An analog-to-digital converter comprising a plurality of tunnel diodes connected in a series string each of said tunnel diodes having two stable states and being transferable from one to the other, a plurality of transistors each having collector, base and emitter electrodes, means for connecting each one of said transistor bases to a different one of said tunnel diode anodes, means for applying a bias to each one of said transistor emitters, means for applying operating potential to the collectors of each one of said transistors, means for applying a bias across said series connected tunnel diodes to bias them to the first of their two states of stability and in conjunction with the bias applied to the emitters of said transistors to supply each one of said transistors with a base current, means for applying the signal to be digitalized across the series connected tunnel diodes, and means responsive to the output derived from said transistors when the associated tunnel diode transfers from the first to its second stable state to digitally indicate the amplitude of said unknown signal.

References Cited by the Examiner

UNITED STATES PATENTS 3,041,469 6/1962 Ross ---------------- 340—347

OTHER REFERENCES

September 1961, RCA Technical Notes, "Analog to Digital Converter," by Amodei et al., No. 492.

February 1961, pages 43–45, IBM Technical Disclosure Bulletin, "Analog to Digital Converter," by Lettieri, vol. 3, No. 9.

MALCOLM A. MORRISON, *Primary Examiner.*